United States Patent [19]
Gutierrez-Aitken

[11] Patent Number: 6,043,549
[45] Date of Patent: Mar. 28, 2000

[54] RESPONSIVITY PHOTODETECTOR

[75] Inventor: Augusto L. Gutierrez-Aitken, Redondo Beach, Calif.

[73] Assignee: TRW Inc., Redondo Beach, Calif.

[21] Appl. No.: 09/045,551

[22] Filed: Mar. 20, 1998

[51] Int. Cl.[7] ............... H01L 31/075; H01L 31/105; H01L 31/117

[52] U.S. Cl. ............... 257/458; 257/53; 257/462; 438/48; 438/57

[58] Field of Search ............... 257/53, 458, 462; 438/48, 57

[56] References Cited

U.S. PATENT DOCUMENTS

| | | | |
|---|---|---|---|
| 4,616,247 | 10/1986 | Chang et al. | 257/458 |
| 4,716,449 | 12/1987 | Miller | 257/21 |
| 5,045,908 | 9/1991 | Lebby | 257/458 |
| 5,311,047 | 5/1994 | Chang | 257/198 |
| 5,329,136 | 7/1994 | Goossen | 257/17 |
| 5,872,016 | 2/1999 | Cunningham et al. | 437/107 |

*Primary Examiner*—Mahshid Saadat
*Assistant Examiner*—Allan R. Wilson
*Attorney, Agent, or Firm*—Michael S. Yatsko; Connie M. Thousand

[57] ABSTRACT

A photodetector having improved responsivity includes first, second and third contact layers and first and second absorption layers. The first and second absorption layers are disposed on opposite sides of the first contact layer. The second contact layer is disposed on the first absorption layer and the third contact layer is disposed on the second absorption layer. The first contact layer has a first polarity. The second and third contact layers have a second polarity which is opposite the first polarity. Preferably, the first and second absorption layers are each made of a material having approximately equivalent electrical characteristics and the second and third contact layers are interconnected. Alternatively, one absorption layer is responsive to a first wavelength and another absorption layer is responsive to a second wavelength.

10 Claims, 7 Drawing Sheets

RESPONSIVITY PHOTODETECTOR

BACKGROUND OF THE INVENTION

This invention relates generally to PIN diode photodetectors, and more particularly to a photodetector with improved responsivity.

Photodetectors are used to convert optical power into photocurrent. A typical PIN diode photodetector includes one absorption layer and two contact layers of opposite polarity with the contact layers positioned on opposite sides of the absorption layer. Light is directed into the absorption layer through one of the contact layers. The light propagates through the absorption layer which absorbs the light and converts it into photogenerated carriers in the form of pairs of positively charged holes and negatively charged electrons. The positively charged holes are attracted to and travel towards the negatively charged contact layer. The negatively charged electrons are attracted to and travel towards the positively charged contact layer. The contact layers collect the electrons and holes. These collected charge carriers constitute the photocurrent.

Bandwidth and responsivity are the most important parameters of a photodetector's performance. Bandwidth is the frequency response or speed of the photodetector measured in Hz. The bandwidth of a photodetector is determined by the transit time of the photogenerated carriers in the absorption region and the RC time constant. The transit time of the photogenerated carriers is a measure of how quickly the electrons and holes reach their respective contact layer and is determined primarily by the thickness and material parameters of the absorption layer. The thinner the absorption layer, the lower the transit time because the electrons and holes have a shorter distance to travel to reach their respective contact layer.

The RC time constant is dependent primarily on the capacitance of the photodetector which is primarily determined by the thickness of the absorption layer and the size or area of the photodetector. The thicker the absorption layer, the lower the capacitance resulting in a photodetector with improved bandwidth.

Responsivity is a measure of how efficiently the photodetector converts optical power into photocurrent. Responsivity is a measure of how much of the light which enters the photodetector is absorbed by the absorption layer and converted into photogenerated carriers. The amount of light absorbed by the absorption layer is an exponential function of the thickness of the absorption layer. Thus, a thick absorption layer absorbs more light than a thin absorption layer providing higher responsivity.

A thin absorption region is desirable for improved transit time. However, a thick absorption region is desired for lower capacitance and higher responsivity. Therefore, in typical photodetectors, there is a trade-off between bandwidth and responsivity.

One configuration employed to increase responsivity without sacrificing bandwidth is to illuminate the absorption layer from the edge of the photodetector instead of through one of the contact layers. This configuration removes the trade-off between bandwidth and responsivity since in this configuration, the transit time is dependent on the thickness of the absorption layer in a direction perpendicular to a direction of propagation of the light, but, the responsivity is dependent on the thickness of the absorption layer in the direction parallel to the direction of propagation of the light. For a high performance photodetector, the vertical distance is typically on the order of 0.3 to 2 $\mu$m and the horizontal distance is typically on the order of 10 to 30 $\mu$m. Therefore, for a typical edge-illuminated photodetector, the vertical thickness of approximately 0.3 to 2 $\mu$m determines the transit time of the photodetector whereas the horizontal thickness of approximately 10 to 30 $\mu$m determines the responsivity of the photodetector. One drawback to this technique is that, in order to couple the light efficiently into the absorption layer, the light must be focused to a small size prior to the light entering the absorption layer. Typically, the light must be focused to a diameter comparable to the thickness of the absorption layer (0.3 to 2 $\mu$m). This is difficult and adds additional complexity to couple the light to the photodetector.

A second method employed to increase the responsivity of the photodetector without sacrificing bandwidth is to use a reflective layer on the bottom of the photodetector. For this method, the light enters the absorption layer through the top contact and propagates through the absorption layer. The absorption layer absorbs only a portion of the light converting that portion into photogenerated carriers. The portion of the light not converted is incident on the reflecting surface which redirects the remaining light back through the absorption layer. The remaining light propagates a second time through the absorption layer and is converted into photogenerated carriers. This method enables a higher responsivity without reducing the bandwidth. One drawback to this method is that it requires a highly reflecting surface or a multiple layer mirror underneath the photodetector. It also complicates greatly the fabrication of the photodetector particularly for systems that operate at a wavelength of 1.55 $\mu$m What is needed therefore is a photodetector which would allow for increased responsivity with minimal impact on the bandwidth but without the complexity of fabrication and without severe constraints of focusing the light.

SUMMARY OF THE INVENTION

The aforementioned need in the prior art is satisfied by this invention, which provides a photodetector having improved responsivity. The improved responsivity photodetector, in accord with the invention, comprises first, second and third contact layers and a first and a second absorption layers. The first and second absorption layers are disposed on opposite sides of the first contact layer. The second contact layer is disposed on the first absorption layer and the third contact layer is disposed on the second absorption layer. The first contact layer has a first polarity, and the second and third contact layers have a second polarity which is opposite the first polarity.

In accordance with a one aspect of the invention, the first and second absorption layers are each made of a material having approximately equivalent optical and electrical characteristics.

In accordance with a second aspect of the invention, one absorption layer is responsive to a first light wavelength and another absorption layer is responsive to a second light wavelength.

In accordance with a third aspect of the invention, the photodetector further comprises a reflective layer disposed on either the second or the third contact layer.

DETAILED DESCRIPTION OF THE INVENTION

Figure 1:
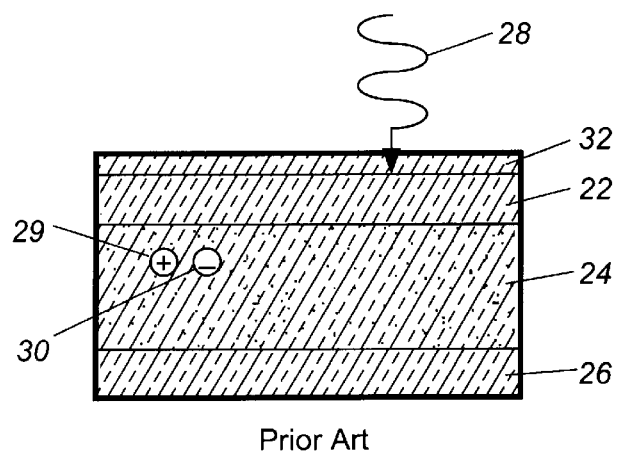
FIG. 1 is a diagram of a typical prior art photodetector.

Referring to FIG. 1, a typical photodetector 20 of the prior art has a anti-reflective coating layer 32, a top contact layer 22, an absorption layer 24 and a bottom contact layer 26. Light 28 passes through the anti-reflective coating 32 and the top contact layer 22 and enters the absorption layer 24. The absorption layer 24 absorbs the light 28 and converts it into photogenerated carriers consisting of positively charged holes 29 and negatively charged electrons 30. The positively charged holes 29 travel towards and are collected by the negatively biased contact layer 22. The negatively charged electrons 30 travel towards and are collected by the positively biased contact layer 26. The collected holes in layer 22 and electrons in layer 26 constitute the photocurrent.

The distance in which the holes 29 and electrons 30 travel to reach the top 22 and bottom 26 contact layers respectively is the primary factor determining the transit time of the photodetector 20. The shorter the distance the holes 29 and electrons 30 travel, the smaller the transit time and the faster the speed of the photodetector 20. Therefore, with respect to transit time, it would be advantageous to make the absorption layer 24 relatively thin to reduce the distance in which the holes 29 and electrons 30 must travel. However, the thickness of the absorption layer 24 is a primary factor determining the responsivity of the photodetector 20. For a typical photodetector 20, responsivity increases with increased thickness of the absorption layer 24 such that it would be advantageous to make the absorption layer 24 as thick as possible. Therefore, there is a trade-off between transit time and responsivity.

Figure 2:
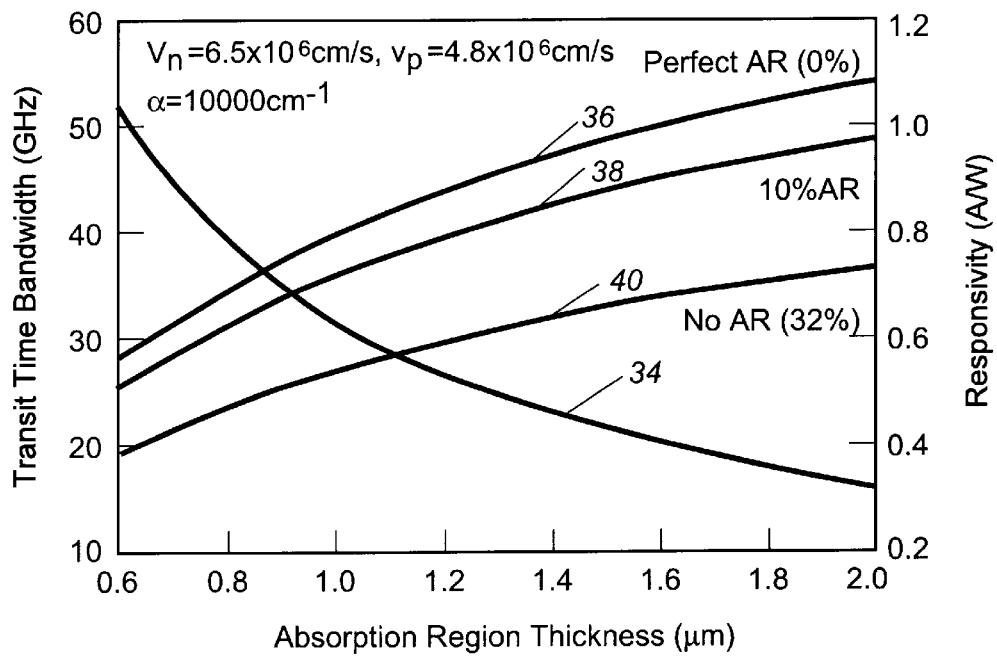
FIG. 2 is a graph of bandwidth and responsivity as a function of absorption region thickness.

FIG. 2 is a graphical depiction of the trade-off between responsivity and transit time. The left vertical axis is the bandwidth limited by the transit time (in GHz); and, the right vertical axis is responsivity (in Ampere/Watts or A/W). The horizontal axis is the absorption layer thickness (in $\mu$m's). Curve 34 is the bandwidth as a function of the absorption layer thickness and curves 36, 38 and 40 are the responsivity for an InGaAs p-i-n diode for different values of anti-reflecting coating. The electron saturation velocity (Vn), hole saturation velocity (Vp) and the absorption coefficient ($\alpha$) parameters used to calculate these curves 34, 36, 38 and 40 are as shown in FIG. 2. The curves 34, 36, 38 and 40 graphically show that responsivity increases and bandwidth decreases with increased absorption layer thickness.

Figure 3:
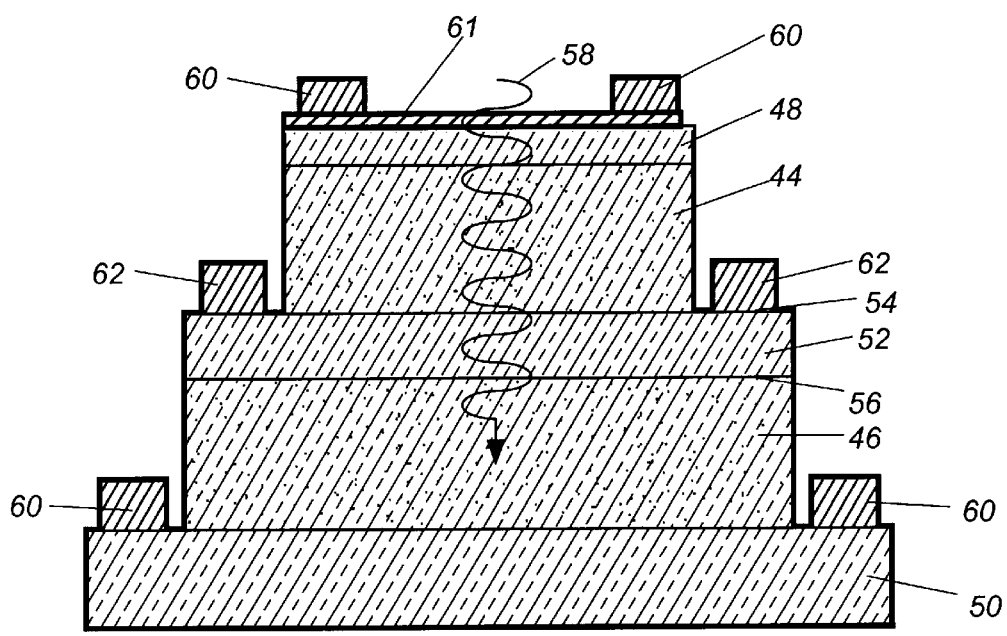
FIG. 3 is a diagram of one embodiment of the present invention.

Referring now to FIG. 3, the improved responsivity photodetector 42 increases responsivity while having minimal impact on bandwidth. The improved responsivity photodetector 42 uses two absorption layers 44 and 46 and three contact layers 48, 50 and 52 instead of one absorption layer 24 and two contact layers 22 and 26 as shown in the typical photodetector 20 of FIG. 1. As shown in FIG. 3, the improved responsivity photodetector 42 has an anti-reflective coating layer 61, a first contact layer 52, a first 44 and second 46 absorption layers, and, a second 48 and a third 50 contact layers. For the preferred embodiment of the invention, the photodetector 42 includes an anti-reflective coating 61 disposed on the second contact layer 48.

The first contact layer 52 has a top side 54, a bottom side 56 and a first polarity. The first absorption layer 44 is disposed on the top side 54 and the second absorption layer 46 is disposed on the bottom side 56 of the first contact layer 52. The second contact layer 48 is disposed on the first absorption layer 44, and, the third contact layer 50 is disposed on the second absorption layer 46. The second 48 and third 50 contact layers each have a second polarity which is opposite to that of the first contact layer 52. For the preferred embodiment of the invention, the first contact layer 52 is of negative polarity and the second 48 and third 50 contact layers are of positive polarity. For an alternative embodiment of the invention, the first contact layer 52 is of a positive polarity and the second 48 and third 50 contact layers are of negative polarity.

For the preferred embodiment of the invention, the light 58 passes through the anti-reflective coating layer 61 and the top contact layer 48 entering and propagating through the first absorption layer 44. The first absorption layer 44 absorbs a portion of the light 58 converting it into positively charged holes and negatively charged electrons. The holes travel towards and are collected by the second contact layer 48 and the electrons travel towards and are collected by the first contact layer 52. The portion of the light that is not absorbed in the first absorption layer 44 passes through the first contact layer 52 entering and propagating through the second absorption layer 46. The second absorption layer 46 absorbs an additional portion of the light 58 converting that portion of the light into additional electrons and holes. The holes travel towards and are collected by the third contact layer 50 and the electrons travel toward and are collected by the first contact layer 52. The holes and electrons collected by the first 52, second 48 and third 50 contact layers constitute the photocurrent.

Figure 8:
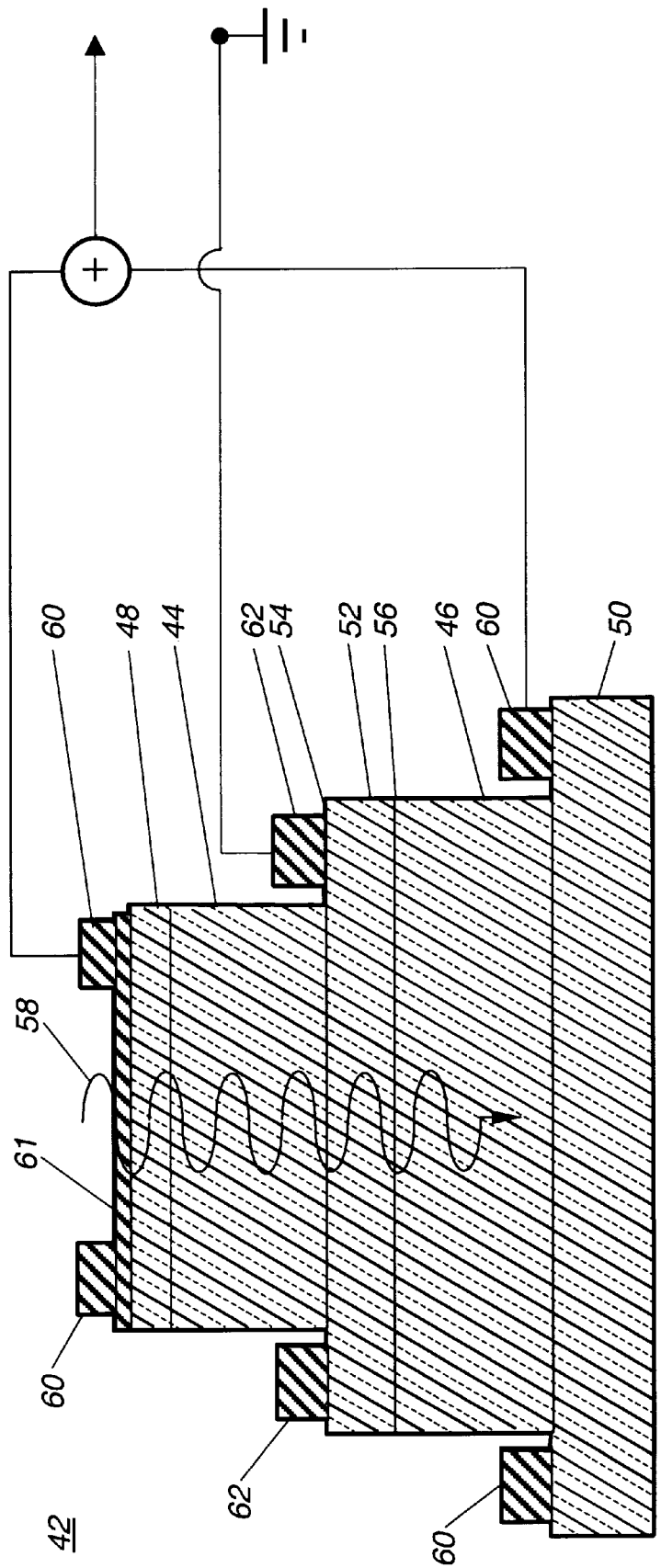
FIG. 8 is a diagram of a fifth embodiment of the invention.

Referring to FIG. 8 for the preferred embodiment of the invention, the first 44 and second 46 absorption layers are made of a material having substantially equivalent optical and electrical characteristics, and, the second 48 and third 50 contact layers are connected together thereby adding together the photocurrents at the second contact layer 48 to the photocurrents at the third contact layer 50. To facilitate external connections to the improved responsivity photodetector 42, the preferred embodiment of the invention includes interconnected p-ohmic contacts 60 on the second 48 and third 50 contact layers and n-ohmic contacts 62 on the first contact layer 52.

When compared to the typical photodetector 20 (FIG. 1), the improved responsivity photodetector 42 (FIG. 3) has increased responsivity since the combined thickness of the first 44 and second 46 absorption layers determines the responsivity of the improved responsivity photodetector 42. In addition, the improved responsivity photodetector 42 does not sacrifice transit time at the expense of responsivity since the transit time is determined by the thickness of either the first absorption layer 44 or the second absorption layer 46, not the overall thickness of the entire absorption region.

Figure 4A:
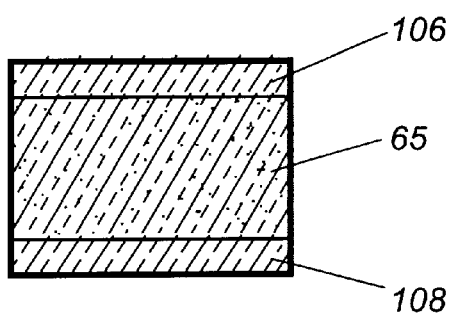
FIG. 4a is a diagram of a prior art photodetector.
Figure 4B:
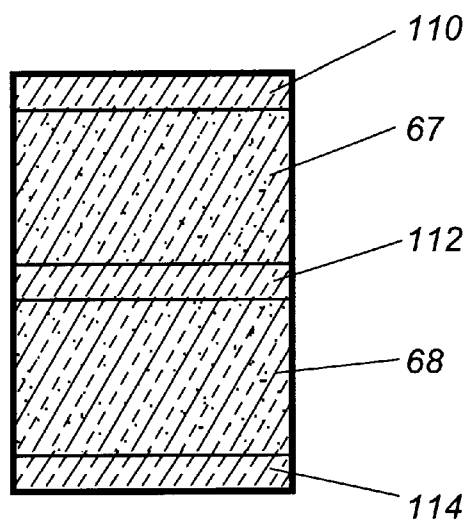
FIG. 4b is a diagram of an improved responsivity photodetector.

FIGS. 4a and 4b show a comparison between a typical photodetector 64 and an improved responsivity photodetector 66 for a specific transit time of 35 GHz. For this specified transit time, the typical photodetector 64 has a single 0.9 $\mu$m thick absorption layer 65 whereas the improved responsivity photodetector 66 having the same transit time has two absorption layers 67 and 68, each being 0.9 μm thick for a total thickness of 1.8 μm. In both photodetectors 64 and 66, the distance to the respective collecting contact layer is at most 0.9 μm making the transit time of both photodetectors 64 and 66 the same. However, the responsivity is increased from 0.67 to 0.95 Ampere/Watts (A/W) when using the improved responsivity photodetector 66 instead of the typical photodetector 64 due to the increase in overall thickness of the total absorption region 67 and 68.

When compared to the typical photodetector 64, the improved responsivity photodetector 66 has a decreased RC time constant which translates into a lower bandwidth. However, as shown in the following example, the decrease in the RC time constant has only a small affect on bandwidth, and, when compared to the improvement in responsivity, the affect on bandwidth is minimal.

The RC time constant is dependent primarily on the capacitance of the photodetector which is primarily a function of the properties of the absorption layers. The typical photodetector 64 has a single absorption layer 65 whereas the improved responsivity photodetector 66 has two absorption layers 67 and 68. Each absorption layer 65, 67 or 68 is essentially electrically equivalent to a diode. Therefore, the typical photodetector 64 is essentially electrically equivalent to a single diode whereas the improved responsivity photodetector 66 is essentially two diodes in parallel resulting in the capacitance of the improved responsivity photodetector 66 being higher than that of a typical photodetector 64 for a given transit time. The increase in capacitance increases the RC time constant which in turn lowers the bandwidth of the improved responsivity photodetector 66. However, this decrease in bandwidth is minimal when compared with the increase in responsivity provided by the improved responsivity photodetector 66. For example, calculations have shown that a typical photodetector 64 having a 0.9 μm thickness has a transit time bandwidth of 35 GHz and an RC time constant bandwidth of 133 GHz. An improved responsivity photodetector 66 having two 0.9 μm thick absorption regions 67 and 68 also has a transit time bandwidth of 35 GHz but has an RC time constant bandwidth of 66 GHz due to the increased capacitance in the improved responsivity photodetector 66. The calculated bandwidth resulting from the combination of the transit time and the RC time constant of the improved responsivity photodetector 66 is 30 GHz compared to 33 GHz for the typical photodetector 64. But, the responsivity of the improved responsivity photodetector 66 is 0.95 A/W whereas the responsivity of the typical photodetector 64 is 0.67 A/W. Therefore, the improved responsivity photodetector 66 increased responsivity by 42% while reducing bandwidth by only 9% As a comparison, if the absorption layer 65 of the typical photodetector 64 were increased to a sufficient thickness to result in a responsivity of 0.95 A/W, the bandwidth of the typical photodetector 64 would decrease to only 18 GHz. Thus, a typical photodetector 64 having the same responsivity as the improved responsivity photodetector 66 would be approximately half the speed of the improved responsivity photodetector 66.

Figure 5:
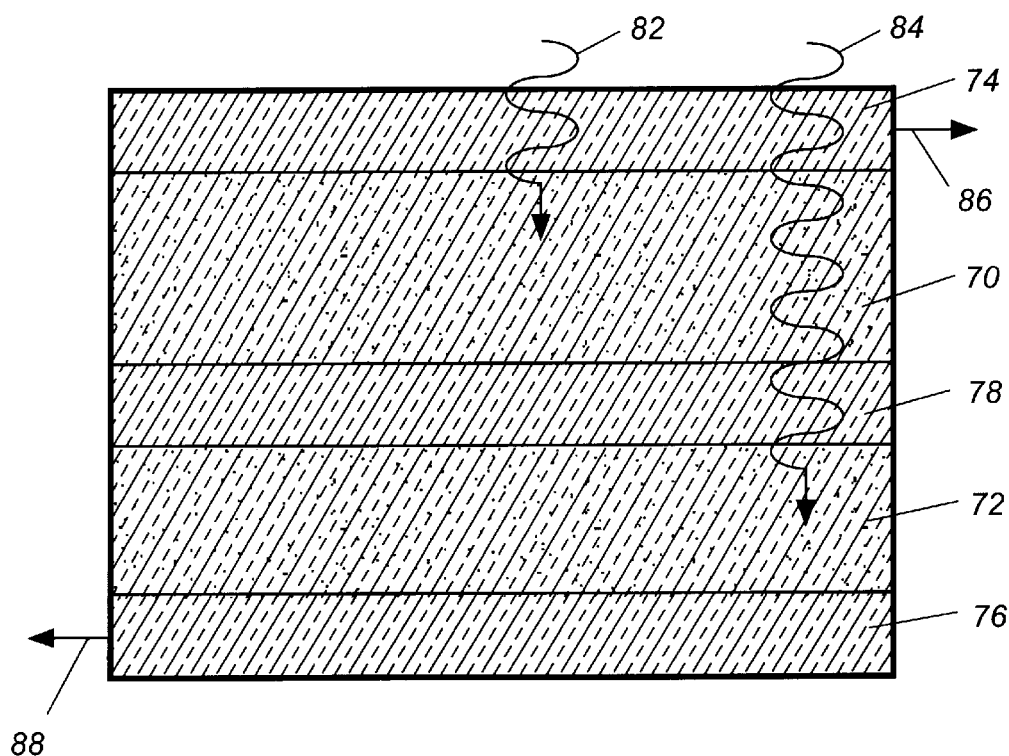
FIG. 5 is a diagram of a second embodiment of the invention.

For one embodiment of the invention, the first absorption layer 67 is responsive to a first light wavelength and the second absorption layer 68 is responsive to a second light wavelength enabling a single improved responsivity photodetector 66 to detect two optical signals with different wavelengths. Referring to FIG. 5., for this embodiment of the invention, a first optical signal 82 having a 1.3 μm wavelength and a second optical signal 84 having a 1.55 μm wavelength enter the improved responsivity photodetector 80, passing through the second contact layer 74 and entering and propagating through the first absorption layer 70. Preferably, the first absorption layer 70 is made of a material comprising InGaAlAs which is responsive to the 1.3 μm signal 82 but is not responsive to the 1.55 μm signal 84. The first absorption layer 70 absorbs the 1.3 μm signal 82 and coverts that signal 82 into photogenerated carriers consisting of electrons and holes; the holes are collected on the second contact layer 74 and the electrons are collected on the first contact layer 78. The 1.55 μm signal 84 propagates through the first absorption layer 70 and the first contact layer 78 and enters the second absorption layer 72. Preferably, the second absorption layer 72 is made of a material comprising InGaAs which is responsive to the 1.55 μm signal 84. The second absorption layer 72 absorbs the 1.55 μm signal 84 converting it into photogenerated carriers consisting of electrons and holes; the holes are collected on the third contact layer 76 and the electrons are collected on the first contact layer 78. In this embodiment of the invention, a 1.3 μm photocurrent 86 is supplied at the second contact layer 74 and a 1.55 μm photocurrent 88 is supplied at the third contact layer 76.

Figure 6:
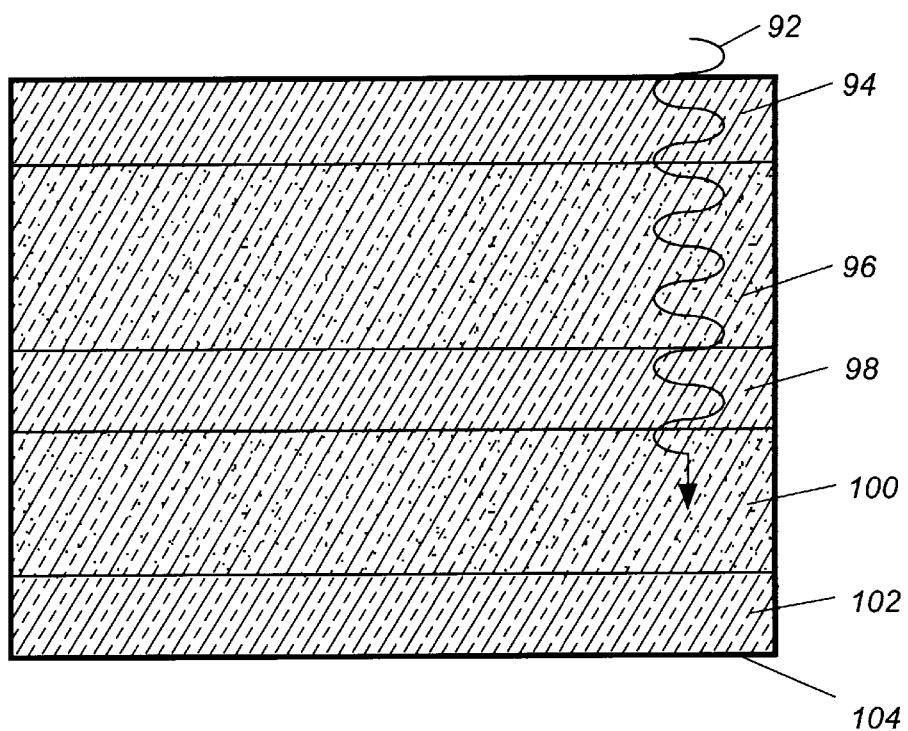
FIG. 6 is a diagram of a third embodiment of the invention.

For an alternative embodiment of the invention, a reflective surface is disposed on either of the second contact layer or the third contact layer of the improved responsivity photodetector. For this embodiment, shown in FIG. 6, the light 92 enters the improved responsivity photodetector 90, passes through the second contact layer 94 and enters the first absorption layer 96. Photogenerated carriers consisting of holes and electrons are generated which are collected by the second 94 and first 98 contact layers respectively. The portion of the light 92 not absorbed by the first absorption layer 96 passes through the first contact layer 98 and enters the second absorption layer 100. Holes and electrons are generated in the second absorption layer 100 and are collected by the third 102 and the first 98 contact layers respectively. The portion of the light 92 not absorbed by the second absorption layer 100 passes through the third contact layer 102 and is incident upon the reflective surface 104. The reflective surface 104 redirects the light 92 back through the third contact layer 102 and into the second absorption layer 100 where more holes and electrons are generated. These holes and electrons are collected by the third 102 and the first 98 contact layers respectively. The remaining light 92 proceeds through the first contact layer 98 and into the first absorption layer 96 where additional holes and electrons are generated. These holes and electrons are collected by second 94 and first 98 contact layers respectively. The second 94 and third 102 contact layers are interconnected such that all the holes are added together. Since the first 96 and the second 100 absorption layers are utilized twice, this configuration enables the overall thickness of the improved responsivity photodetector to be decreased.

Figure 7:
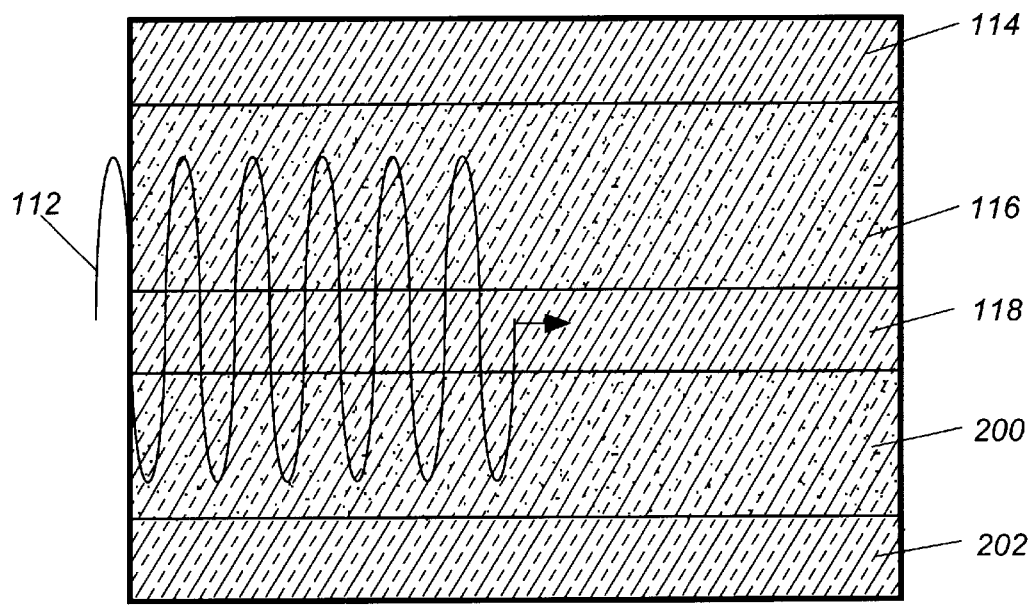
FIG. 7 is a diagram of a fourth embodiment of the invention.

Referring to FIG. 7, for an alternative embodiment of the invention, the photodetector 110 is illuminated from the edge or side. For this embodiment, the light 112 enters the first 116 and second 200 absorption regions through the edge of the photodetector 110. The first 116 and second 200 absorption layers absorb the light 112 converting it into positively charged holes and negatively charged electrons. The holes travel towards and are collected by the second 114 and third 202 contact layers and the electrons travel towards and are collected by the first contact layer 1 18. The holes and electrons collected by the first 118, second 114 and third 202 contact layers constitute the photocurrent.

The total absorption region for the edge illuminated improved responsivity photodetector 110 is the sum of the first 116 and the second 200 absorption regions, and, the transit time depends on the thickness of the first 116 and second 200 absorption regions in the direction perpendicular to the direction of propagation of the light 112. Therefore, the edge illuminated improved responsivity photodetector 110 provides a larger edge profile than a typical edge illuminated photodetector without sacrificing transit time. Unlike a typical edge illuminated photodetector, the improved responsivity edge illuminated photodetector 110 reduces the need to focus the light to a small size prior to the light entering the absorption region. This can greatly facilitate the coupling of light into the photodetector.

The present invention is not limited to two absorption layers and three contact layers but rather may be configured with additional absorption layers and additional contact layers. It will be appreciated by persons skilled in the art that the present invention is not limited to what has been shown and described hereinabove. The scope of the invention is limited solely by the claims which follow.

I claim as my invention:

1. A photodetector for generating photocurrent from an input light source having a first wavelength comprising:

a first contact layer having a top side, a bottom side and a first polarity; first and second absorption layers each of which being responsive to said input light source, said first absorption layer being disposed on said top side of said first contact layer, said second absorption layer being disposed on said bottom side of said first contact layer, said first and second absorption layers being responsive to said input light source and operative to generate therefrom first and second photocurrents, respectively;

second and third contact layers, said second contact layer being disposed on said first absorption layer, said third contact layer being disposed on said second absorption layer, said second and third contact layers having a second polarity opposite said first polarity, said second and third contact layers collecting said first and second generated photocurrents, respectively; and, photocurrent addition means for adding together said first and second photocurrents.

2. A photodetector as in claim 1, further including an anti-reflective coating disposed on said second contact layer.

3. A photodetector as in claim 1, wherein said first polarity is positive.

4. A photodetector for generating a first photocurrent from a first input light source having a first wavelength and a second photocurrent from a second input light source having a second wavelength comprising:

a first contact layer having a first polarity;

first and second absorption layers being disposed on opposite sides of said first contact layer, said first absorption layer being responsive to said first input light source and operative to generate said first photocurrent therefrom, said second absorption layer being responsive to said second input light source and operative to generate said second photocurrent therefrom;

second and third contact layers, said second contact layer being disposed on said first absorption layer, said third contact layer being disposed on said second absorption layer, said second and third contact layers each having a second polarity opposite said first polarity, said second and third contact layers collecting said first and second generated photocurrents, respectively; and, means for outputting said first and second generated photocurrents from said first and second contact layers.

5. A photodetector as in claim 4, wherein said first wavelength 1.3 $\mu$m and said second wavelength 1.55 $\mu$m.

6. A photodetector as in claim 5, wherein said first absorption layer is made of a material comprising InGaAlAs and said second absorption layer is made of a material comprising InGaAs.

7. A photodetector as in claim 1, wherein said first and second absorption layers are made of a material having substantially equivalent optical and electrical characteristics.

8. A photodetector as in claim 4, wherein said first absorption layer is InGaAlAs and said second absorption layer is InGaAs.

9. The photodetector of claim 1, wherein each absorption layer is made of a material comprising InGaAs.

10. The photodetector of claim 1, wherein each absorption layer is made of a material comprising InGaAlAs.

* * * * *

UNITED STATES PATENT AND TRADEMARK OFFICE
CERTIFICATE OF CORRECTION

PATENT NO. : 6043549
DATED : March 28, 2000
INVENTOR(S) : Augusto L. Gutierrez-Aitke It is certified that error appears in the above-indentified patent and that said Letters Patent is hereby corrected as shown below:

On title page, item 54 Title
  replace "RESPONSIVITY PHOTODETECTOR"
  with --AN IMPROVED RESPONSIVITY PHOTODETECTOR--.

Signed and Sealed this

Twentieth Day of March, 2001

Attest:

NICHOLAS P. GODICI

*Attesting Officer*     *Acting Director of the United States Patent and Trademark Office*